(12) United States Patent
Yang

(10) Patent No.: US 10,103,204 B2
(45) Date of Patent: Oct. 16, 2018

(54) FLEXIBLE DISPLAY APPARATUS AND METHOD OF MANUFACTURING FLEXIBLE DISPLAY APPARATUS

(71) Applicant: Samsung Electronics Co., Ltd., Suwon-si (KR)

(72) Inventor: Joon-hyun Yang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/651,193

(22) Filed: Jul. 17, 2017

(65) Prior Publication Data

US 2018/0061903 A1 Mar. 1, 2018

(30) Foreign Application Priority Data

Aug. 23, 2016 (KR) .................. 10-2016-0106820

(51) Int. Cl.
*G06F 1/16* (2006.01)
*G06F 3/041* (2006.01)
(Continued)

(52) U.S. Cl.
CPC ...... *H01L 27/3211* (2013.01); *H01L 27/3241* (2013.01); *H01L 51/0097* (2013.01); *H01L 51/0023* (2013.01); *H01L 2251/566* (2013.01)

(58) Field of Classification Search
CPC ............ H01L 27/3211; H01L 27/3241; H01L 27/3258; H01L 27/32; H01L 51/00;
(Continued)

(56) References Cited

U.S. PATENT DOCUMENTS 7,276,273 B2   10/2007  Clovesko et al.
8,863,038 B2 * 10/2014  King ................... G06F 1/1616
                                                  345/173
(Continued)

FOREIGN PATENT DOCUMENTS

JP    2004-79731     3/2004
JP    2012-212335    11/2012
(Continued)

OTHER PUBLICATIONS

International Search Report dated Nov. 9, 2017 in corresponding International Patent Application No. PCT/KR2017/007795, 5 pages.
(Continued)

*Primary Examiner* — Dao H Nguyen
(74) *Attorney, Agent, or Firm* — Staas & Halsey LLP

(57) ABSTRACT

A flexible display apparatus and a method of manufacturing the flexible display apparatus that includes a first cover, a display panel configured to be disposed on a surface of the first cover and include a first panel configured to be divided into a first pixel part and a first driving part so as to enable the first pixel part and the first driving part to be folded on a first folding line and a second panel configured to be divided into a second pixel part and a second driving part so as to enable the second pixel part and the second driving part to be folded based on a second folding line, and a second cover configured to cover a back surface of the display panel. The first panel and the second panel are respectively folded by or on the first folding line and the second folding line to be disposed adjacent to each other so as to provide one image.

20 Claims, 9 Drawing Sheets
(1 of 9 Drawing Sheet(s) Filed in Color)

(51) Int. Cl.
*G06F 3/00* (2006.01)
*H01L 27/32* (2006.01)
*H01L 51/00* (2006.01)

(58) Field of Classification Search
CPC . H01L 51/0023; H01L 51/0097; H01L 51/52;
H01L 51/5256; H05K 7/02; G06F
1/1635; G06F 1/1694; G06F 1/26; G06F
3/041; G06F 3/0486; G06F 3/04817
USPC ........ 345/156, 173, 204; 313/500, 502, 506,
313/511; 715/702, 748, 863; 257/103,
257/181
See application file for complete search history.

(56) References Cited

U.S. PATENT DOCUMENTS

| | | | |
|---|---|---|---|
| 9,048,444 | B2 | 6/2015 | Kim et al. |
| 9,710,033 | B2* | 7/2017 | Yamazaki ............. G06F 1/1635 |
| 2005/0042317 | A1 | 2/2005 | Babish et al. |
| 2012/0249458 | A1 | 10/2012 | Okazaki et al. |
| 2013/0300678 | A1 | 11/2013 | Kang et al. |
| 2014/0253830 | A1 | 9/2014 | Li et al. |
| 2015/0021570 | A1 | 1/2015 | Kim et al. |
| 2015/0227248 | A1* | 8/2015 | Yamazaki ............. G06F 3/0412 345/173 |
| 2015/0233557 | A1* | 8/2015 | Aoyama ............... F21V 21/145 362/183 |
| 2015/0359065 | A1 | 12/2015 | Park et al. |
| 2016/0275830 | A1* | 9/2016 | You ......................... G06F 3/041 |
| 2017/0179432 | A1* | 6/2017 | Visweswaran ...... H01L 51/5256 |

FOREIGN PATENT DOCUMENTS

| | | |
|---|---|---|
| KR | 10-2006-0051764 | 5/2006 |
| KR | 10-2006-0088614 | 8/2006 |
| KR | 10-2011-0124727 | 11/2011 |
| KR | 10-2013-0126007 | 11/2013 |
| KR | 10-2015-0010411 | 1/2015 |
| KR | 10-2015-0031844 | 3/2015 |
| KR | 10-2015-0037232 | 4/2015 |

OTHER PUBLICATIONS

Written Opinion dated Nov. 9, 2017 in corresponding International Patent Application No. PCT/KR2017/007795, 6 pages.

* cited by examiner

FLEXIBLE DISPLAY APPARATUS AND METHOD OF MANUFACTURING FLEXIBLE DISPLAY APPARATUS

CROSS-REFERENCE TO RELATED APPLICATIONS

This application claims priority from Korean Patent Application No. 10-2016-0106820, filed on Aug. 23, 2016, in the Korean Intellectual Property Office, the disclosure of which is incorporated herein by reference in its entirety.

BACKGROUND

Field

Apparatuses and methods consistent with the embodiments relate to a flexible display apparatus and a method of manufacturing the flexible display apparatus, and more particularly, to a flexible display apparatus that secures flexibility and freely extends in a self-emitting type display apparatus such as a light-emitting diode (LED) or the like, and a method of manufacturing the flexible display apparatus.

Description of the Related Art

A general light-emitting diode (LED) display includes LEDs that are connected to LED drivers of the same channel line by line and outputs a screen image through scanning performed line by line in order to reduce the number of necessary LED driver integrated circuits (ICs). In case of an LED display, LEDs emit undesired light due to capacitor components parasitized in circuits and elements. This is referred to as a ghost phenomenon, and a pre-charge circuit and a discharge circuit for solving this phenomenon are used. In order to reduce the number of necessary LED driver ICs, the general LED display includes an LED controller IC part that receives an image signal and transmits the image signal as data having a format appropriate for LED drivers to the LED drivers so as to control brightness of the LEDs with the timing. A power supply unit supplies a current to the LEDs and supplies the LEDs with power for driving the whole system.

However, since an existing LED display includes a large number of parts and uses a multilayer printed circuit board (PCB), it is difficult for the existing LED display to be flexible such as being curved, bendable, or the like.

Also, the existing LED display requires a very complicated structure in order to extend a screen.

SUMMARY

Exemplary embodiments overcome the above disadvantages and other disadvantages not described above. Also, the embodiments are not required to overcome the disadvantages described above, and an exemplary embodiment may not overcome any of the problems described above.

The embodiments provide a flexible display apparatus that secures flexibility and freely extends in a self-emitting type display apparatus such as a light-emitting diode (LED) or the like, and a method of manufacturing the flexible display apparatus.

According to an aspect of the embodiments, a display apparatus includes a flexible display apparatus including a first cover, a display panel configured to be disposed on a surface of the first cover and include a first panel configured to be divided into a first pixel part and a first driving part so as to enable the first pixel part and the first driving part to be folded based on a first folding line and a second panel configured to be divided into a second pixel part and a second driving part so as to enable the second pixel part and the second driving part to be folded based on a second folding line, and a second cover configured to cover a back surface of the display panel. The first panel and the second panel may be respectively folded by the first folding line and the second folding line to be adjacent to each other so as to provide one image.

The first cover may be formed of a poly material and has a film shape.

The first panel may display a first area of the one image, and the second panel may display a second area of the one image.

The flexible display apparatus may further include a radiator panel configured to be disposed between the first pixel part and the first driving part and between the second pixel part and the second driving part so as to operate as emitting heat.

The radiator panel may be formed of a conductive material and have flexibility.

The flexible display apparatus may further include a circuit connection part configured to be disposed on the first driving part and the second driving part so as to connect the first driving part and the second driving part to each other.

A first substrate on which the first pixel part and the first driving part are formed and a second substrate on which the second pixel part and the second driving part are formed may be formed of an equal material.

At least a surface of the first cover may have an uneven state in order to improve a quality of an image provided for a user.

The at least surface of the first cover may include an embossed pattern so as to enable the first cover to have the uneven state.

The first panel and the second panel may be disposed to be adjacent to each other so as to form a zero bezel, wherein a fixed gap between pixels of the first panel and the second panel is maintained by the formed zero bezel.

According to another aspect of the embodiments, a method of manufacturing a flexible display apparatus, includes providing a first cover, disposing a first panel on a surface of the first cover, wherein the first panel is divided into a first pixel part and a first driving part so as to enable the first pixel part and the first driving part to be folded based on a first folding line, disposing a second panel so as to be adjacent to the first panel, wherein the second panel is divided into a second pixel part and a second driving part so as to enable the second pixel part and the second driving part to be folded based on a second folding line, and covering the first panel and the second panel with a second cover. The first panel and the second panel may be respectively folded by the first folding line and the second folding line to be adjacent to each other so as to provide one image.

The first cover may be formed of a poly material and have a film shape.

The first panel may be constituted to display a first area of the one image, and the second panel may be constituted to display a second area of the one image.

The method may further include disposing a radiator panel configured to be disposed between the first pixel part and the first driving part and between the second pixel part and the second driving part and to operate as emitting heat.

The radiator panel may be formed of a conductive material and have flexibility.

The method may further include disposing a circuit connection part configured to connect the first driving part and the second driving part to each other, on the first driver part and the second driver part.

A first substrate on which the pixel part and the first driving part are formed and a second substrate on which the second pixel part and the second driving part are formed may be formed of an equal material.

At least a surface of the first cover may have an uneven state in order to improve a quality of an image provided for a user.

The at least surface of the first cover may include an embossed pattern so as to enable the first cover to have the uneven state.

The first panel and the second panel may be disposed to be adjacent to each other so as to have a zero bezel that maintains a fixed gap between pixels of the first panel and the second panel.

Additional and/or other aspects and advantages of the embodiments will be set forth in part in the description which follows and, in part, will be obvious from the description, or may be learned by practice of the embodiments.

BRIEF DESCRIPTION OF THE DRAWING FIGURES

The patent or application file contains at least one drawing executed in color. Copies of this patent or patent application publication with color drawings will be provided by the Office upon request and payment of the necessary fee. The above and/or other aspects of the embodiments will be more apparent by describing certain exemplary embodiments with reference to the accompanying drawings, in which.

DETAILED DESCRIPTION OF THE EXEMPLARY EMBODIMENTS

Figure 1:
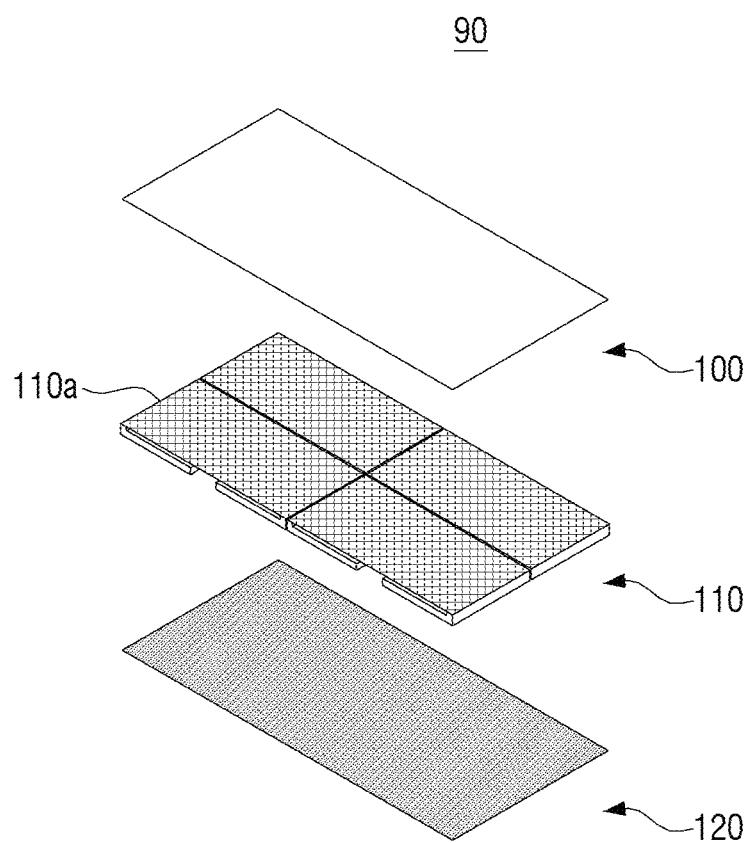
FIG. 1 illustrates a flexible display apparatus according to an exemplary embodiment.

Certain exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding of the embodiments. Thus, it is apparent that the exemplary embodiments can be carried out without those specifically defined matters. Also, well-known functions or constructions are not described in detail since they would obscure the description with unnecessary detail.

Hereinafter, exemplary embodiments will now be described in detail with reference to the attached drawings.

Figure 2:
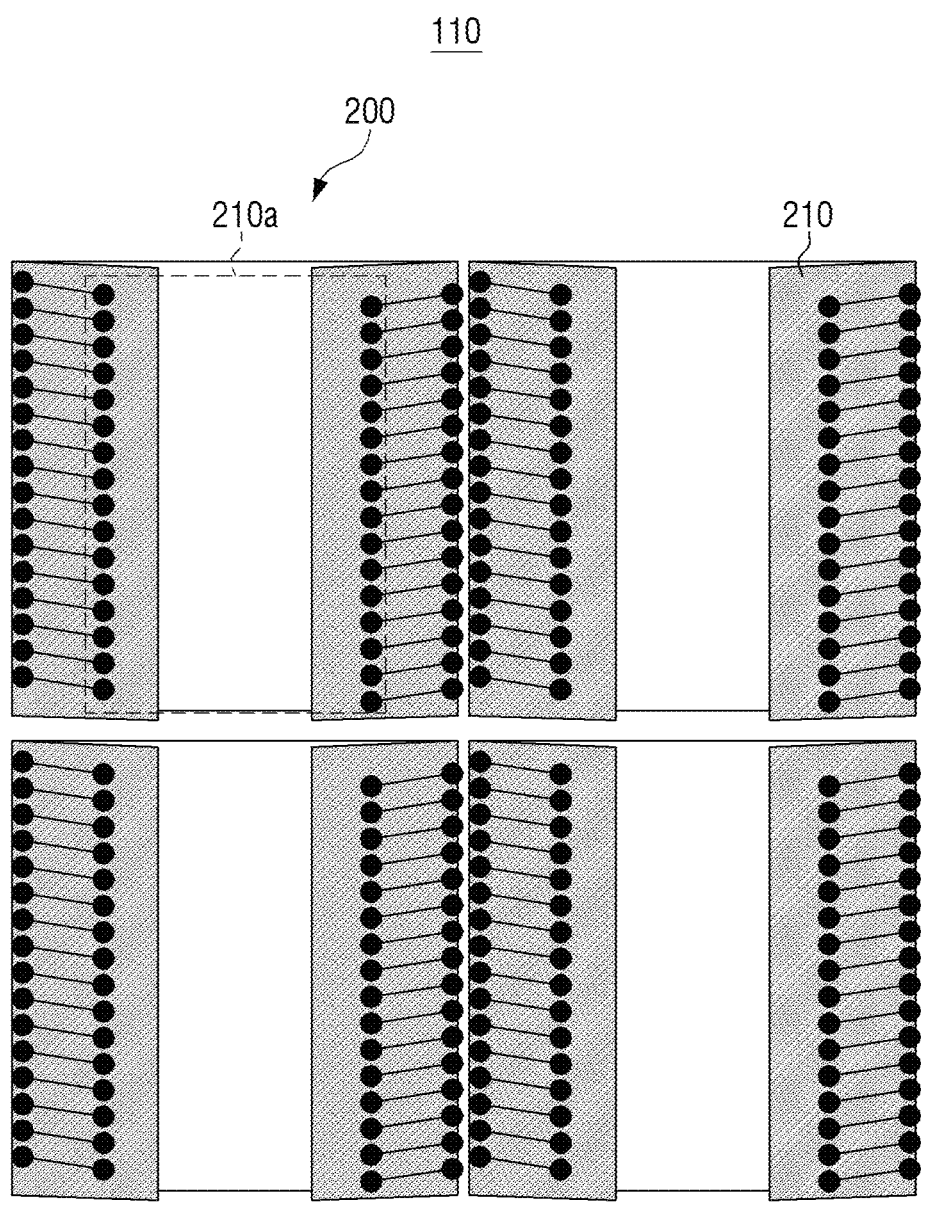
FIG. 2 is a rear view of a display panel of FIG. 1.

FIG. 1 illustrates a flexible display apparatus 90 according to an exemplary embodiment. FIG. 2 is a rear view of a display panel 110 of FIG. 1.

As shown in FIG. 1, the flexible display apparatus 90 according to the exemplary embodiment includes a front cover (or a first cover) 100, the display panel 110, and a back cover (or a second cover) 120.

Here, the front cover 100 may include a poly-based film such as polyethylene or polyethylene terephthalate (PET). The front cover 100 is formed of a transparent material and to provide flexibility and also operates as a protective film for protecting a front pixel area of the display panel 110 from the outside. Since an image realized on the display panel 110 is to be seen to an external user, the front cover 100 is transparent. Here, the front cover 100 may have an embossed pattern, a texture, uneven surface or the like that is formed on a front surface thereof that a user looks at or on a back surface thereof that the display panel 110 contacts in order to improve a quality of an image. An element for improving an image quality may have various types and thus is not particularly limited to the above-described contents. For example, this is because an additional sheet may be further used on the cover 110 in order to improve an image quality in an exemplary embodiment.

When the front cover 100 is manufactured on a production line, the front cover 100 may be formed by a manufacturer to have a desired size. However, it actually very difficult if not impossible for a large panel (ex. 52-inch panel) to be formed at a large size at one time on a production line. Therefore, the front cover 100 according to an exemplary embodiment may include a plurality of front covers 100. Here, "the inclusion of the plurality of front covers 100" means that a plurality of unit covers are connected to (or combined with) one another to form one or a single front cover. In an exemplary embodiment, forming one front cover may not be particularly limited to one method.

The display panel 110 (FIG. 2) includes a pixel area (or a pixel part) 200 and a driving area (or a driving unit) 210. The pixel area 200 is an area on which an image is realized or formed, and the driving area 210 corresponds to an area that drives the pixel area 200 so as to enable an image to be realized or produced in the pixel area 200. The pixel area 200 is disposed on a back surface of the front cover 100, and the driving area 210 extends from a side of the pixel area 200 to be bent and disposed on a back surface of the pixel area 200. In other words, the driving area 210 is folded to be disposed on a back side. The concept "front" or "back" mentioned in exemplary embodiments is based on a direction in which a user looks to view an image.

The pixel area 200 constituting the display panel 110 may be formed by combining a plurality of unit panels (or panels) 110a (FIG. 1). Therefore, an extension from a small and medium panel to a large panel may be possible. For example, this extension is achieved by extending the display panel 110, attaching the extended display panel 110 onto a back surface of the front cover 100, and connecting the driver areas 210 to one another.

Also, according to an exemplary embodiment, the display panel 110 is to secure or provide a display having flexibility, and thus a substrate forming the display panel 110 also has flexibility. For example, according to an exemplary embodiment, a base substrate forming the display panel 110 is poly-based and may be formed by combining substrates each having a width of 200 mm and a thickness of 50 μm. For example, Lumirror T60 of ToXXy Industries Company may be used.

If the base substrate (ex. a PET substrate coated with ultraviolet hardening phase transformation epoxy SU8 of Microcem Company) is provided, circuit wrings or the like (ex. conductive ink of EMS company) may be formed on a substrate through a roll-to-roll imprinting method or the like. Also, package type (organic) light-emitting diode (O)LED devices are inserted into the pixel area 200 on the substrate. The display panel 110 may be formed through these methods. In addition, as shown in FIG. 2, driving ICs 210a are mounted (or installed) in the driving area 210. The driving ICs 210a may include data/scan drivers and the like. Since the driving ICs 210a are designed in small sizes, disposing the driving ICs 210a in the driving area 210 does not interrupt or materially affect flexibility of the display panel 110, i.e., a bending operation of the display panel 110. Also, installation using a bumping adhesion process may be used in relation to installing of the driver ICs 210a, and thus how the driving ICs 210a are mounted may not be particularly limited.

Also, since the driving area 210 is bent (or folded) as described above when a plurality of unit panels 110a are combined, there is no bezel area between a unit panel (or a first panel) 110a and a unit panel (or a second panel) 110a. Therefore, it is not difficult for the display panel 110 to realize contiguous pixels. A combination line between the unit panels 110a may be exposed to the outside, but additional coating processing or the like may be performed on a combination part. Alternatively, an additional sheet may be added on the combination part, and thus it may not be difficult to improve an image quality. Even if additional coating processing is performed on the back surface of the front cover 100, an image may be prevented from being distorted.

The back cover 120 may include a black cover having flexibility and, for example, may include a film. The back cover 120 may be a poly-based cover. As long as the back cover 120 has flexibility, the back cover 120 may be combined with the front cover 110 in various shapes so as to form the flexible display apparatus 90 according to the exemplary embodiment. Most simply, the back cover 120 may be combined with the front cover 110 according to an adhesive method. Therefore, in an exemplary embodiment, a method of combining the back cover 120 with the front cover 110 may not be particularly limited.

Figure 3:
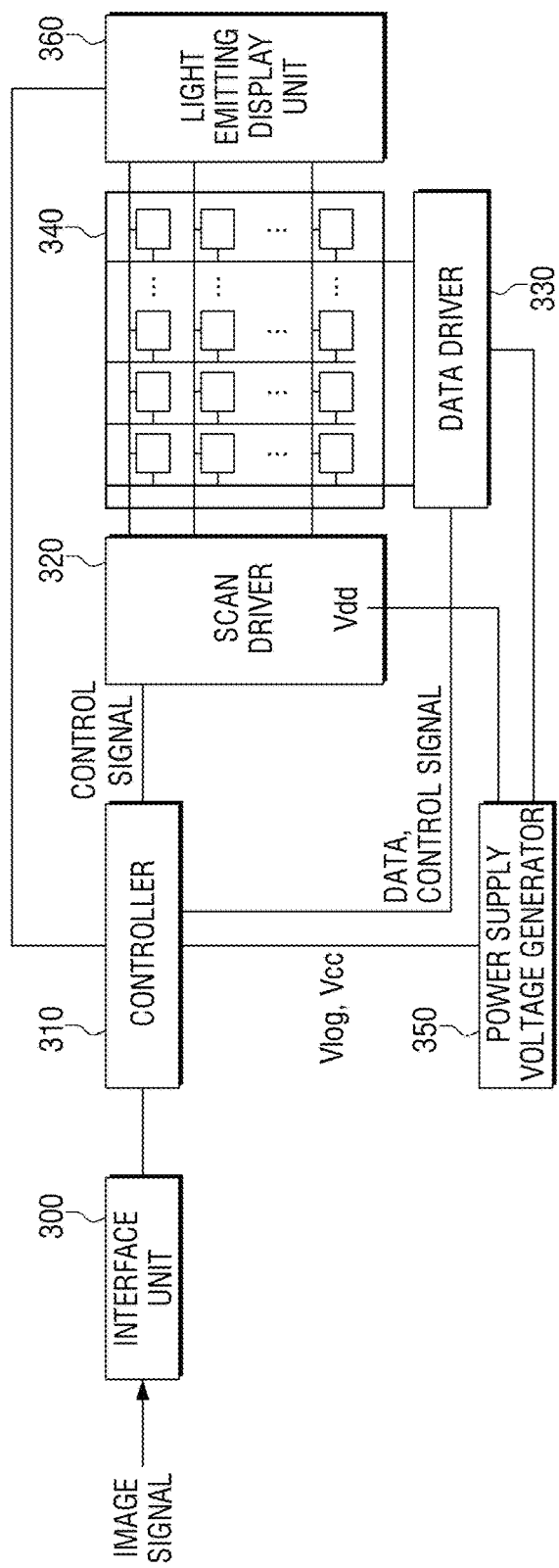
FIG. 3 is a block diagram of the display panel of FIG. 1.

FIG. 3 is a block diagram of the display panel 100 of FIG. 1.

As shown in FIG. 3, the display panel 110 an exemplary embodiment may include some or all of an interface unit 300, a controller 310, a scan driver 320, a data driver 330, a display unit 340, a power supply voltage generator 350, and a light emitting display unit 360.

Here, the inclusion of some or all may means that a system is or may be constituted by omitting some elements, such as the light emitting display unit 360 and the like, or by integrating some elements. All elements will be described as being included to help provide a sufficient understanding of the embodiments.

The interface unit 300 may operate as an image board, such as a graphic card, that converts and outputs image data, which is input from an external source, so as to enable the image data to be appropriate for a resolution of the flexible display apparatus 90. Here, the image data may include R, G, and B video data having 8 bits or more, and the interface unit 300 generates control signals, such as a clock signal DCLK, vertical/horizontal sync signals Vsync and Hsync and the like, appropriate for the resolution of the flexible display apparatus 90. Thereafter, the interface unit 300 provides the controller 310 with the vertical/horizontal sync signals and the image data.

Besides this, the interface unit 300 may include a tuner that receives a particular broadcast program from an external broadcasting station, a demodulator that demodulates an image signal input through the tuner, a demultiplexer that divides the demodulated image signal into video/audio data and additional information, a decoder that respectively decodes the divided video/audio data, an audio processor that converts the decoded audio data into a format appropriate for a speaker, and the like.

The controller 310 generates a control signal for controlling the scan driver 320 and the data driver 330 in order to display input RGB image data on the display unit 340. Also, the controller 310 may represent grayscale information of R, G, and B data by using a logic voltage Vlog provided from the power supply voltage generator 350. For example, if grayscale information of R is generated by using a logic voltage of 3.3V, 8-bit information "10001001" may be generated by representing 3.3V as 1 and 0V as O.

The controller 310 may generate a Gate Shift Clock (GSC), Gate Output Enable (GOE), a Gate Start Pulse (GSP), or the like as a gate control signal for controlling the scan driver 320. Here, the GSC may correspond to a signal that determines a time when a switching element connected to light emitting devices, such as R, G, and B LEDs (or OLEDs), is turned on and/or off. Also, the GOE may correspond to a signal that controls an output of the scan drive 320, and the GSP may correspond to a signal that signals a first driving line of a screen from one vertical sync signal.

In addition, the controller 310 may generate a Source Sampling Clock (SSC), Source Output Enable (SOE), a Source Start Pulse (SSP), or the like as a data control signal. Here, the SSC is used as a sampling clock for latching data in the data driver 330, and the SOE transmits pieces of data latched by the SSC to the display unit 340. The SSP is a signal that signals a start of latching or sampling of data during 1 horizontal sync period.

In more detail, if the data driver 330 includes ICs of TCL 5958 series of Texas Instrument Company, the controller 310 an exemplary embodiment may be constituted so as to process a corresponding IC, a data signal, and a signal such as a Serial Data Shift Clock (S CLK), LAT, grayscale (GS) pulse width modulation (PWM) reference clock (G CLK), or the like. Here, the data signal is R, G, and B grayscale data. Also, the S CLK is a signal for shifting data input into the data driver 300 to a shift register (ex. a 48-bit common shift register, MSB-most significant bit) by synchronizing the data with a rising edge of the S CLK. Data stored in the shift register is shifted to the MSB at the rising edge of each S CLK. Also, the LAT is a signal for latching data from the MSB to a memory (ex. a GS data memory) at a falling edge. Also, the G CLK is a signal for increasing a GS counter one by one at a rising edge of each G CLK to control PWM. Various signals as described above may be changed and thus may not be particularly limited to the above-described contents in an exemplary embodiment.

Based on the above-described contents, the controller 310 may include a control signal generator (not shown), a data rearranger (not shown), and the like. Here, if a time for displaying an image of a unit frame on the display unit 340 is 16.7 ms, the control signal generator generates a control signal so as to display the image of the unit frame within the corresponding time. Also, the data rearranger may reprocess input RGB image data so as to enable the RGB image data to be appropriate for the display unit 340. For example, the rearranger may perform an operation of converting 8-bit data into 64-bit data or the like.

The scan driver 320 receives a gate on/off voltage Vdd/Vss from the power supply voltage generator 350 and applies the corresponding gate on/off voltage Vdd/Vss to the display unit 340 under control of the controller 310. However, in an exemplary embodiment, a gate off voltage is designed as a ground voltage. The gate on voltage Vdd is sequentially provided from scan line 1 GL1 to scan line N GLn in order to realize a unit frame image on the display unit 340. According to an exemplary embodiment, the scan driver 320 operates in response to a scan signal generated by the controller 310. For this, the scan driver 320 may include switching elements that are respectively connected to a power supply voltage source and scan lines. The switching elements may use thin film transistor (TFT) elements or may use transistors (TRs) and metal oxide semiconductor field effect transistors (MOSFETs).

The data driver 330 may convert serial R, G, and B video data provided from the controller 310 into parallel R, G, and B video data, convert digital data into an analog current or a duty cycle on current (ex. a pulse current), simultaneously provide the display unit 340 with video data corresponding to one horizontal line, and sequentially provide the video data on horizontal lines. For example, digital information of video data provided from the controller 310 is converted into an analog current for representing grayscales of colors and then provided for the display unit 340. The analog current may be a pulse type current. Here, the data driver 330 may also synchronize with a gate signal provided from the scan driver 320 to output unit frame data.

A detailed structure of the data driver 330 has been well known to those skilled in the art and thus may blur the essentials of the embodiments. Therefore, the detailed structure of the data driver 330 will be omitted. In other words, a structure of the data driver 330 may be constituted as various types according to whether a light emitting device is driven by a constant current or a constant voltage. Therefore, in an exemplary embodiment, for convenience of description, the structure of the data driver 330 may be simply written as a current source as shown in FIG. 3 in order to represent a constant current. However, a TLC5958 series IC of Texas Instrument Company may be used as the data driver 330.

In the display unit 340, a plurality of scan lines and a plurality of data lines are formed to intersect with one another so as to define a pixel area, and R, G, and B light emitting devices, such as LEDs (or OLEDs), are formed in the pixel area. If a current path is formed between scan lines and ground through the data driver 330 after a power supply voltage is applied to each of the scan lines of the display unit 340, light emitting devices generate currents corresponding to grayscale information thereof through a data line connected to a corresponding scan line for which the power supply voltage is provided. Brightness of the display unit 340 according to an exemplary embodiment is controlled according to a charge amount flowing through the current path as mentioned above so as to display an image. The light emitting devices may be driven by a constant voltage and thus may not be particularly limited to the above-described contents in an exemplary embodiment.

The power supply voltage generator 350 receives commercial power, i.e., an alternating current (AC) voltage of 110 V or 220 V, from an external source, to generate and output a direct current (DC) voltage having various levels. For example, for the controller 310, the power supply voltage generator 350 may generate and provide a DC voltage of 3.3V as a logic voltage so as to represent grayscale data. Also for the scan driver 320, the power supply voltage generator 350 may generate and provide a voltage of various sizes, such as a DC voltage of 4.5V and the like, as the gate on voltage Vdd. If the controller 310, the scan driver 320, and the data driver 330 are constituted as IC types, the power supply voltage generator 350 may generate a voltage Vcc input into the ICs.

When each scan line of the display unit 340 performs a discharging operation, the light emitting display unit 340 discharges a parasitic charge, which is generated by a parasitic capacitor of each scan line, to ground. Here, the light emitting display unit 360 may be controlled by the controller 310. A control time may occur between a time when the power supply voltage Vdd provided for the scan line 1 is interrupted and a time when the power supply voltage Vdd is provided for the scan line 2.

Figure 4:
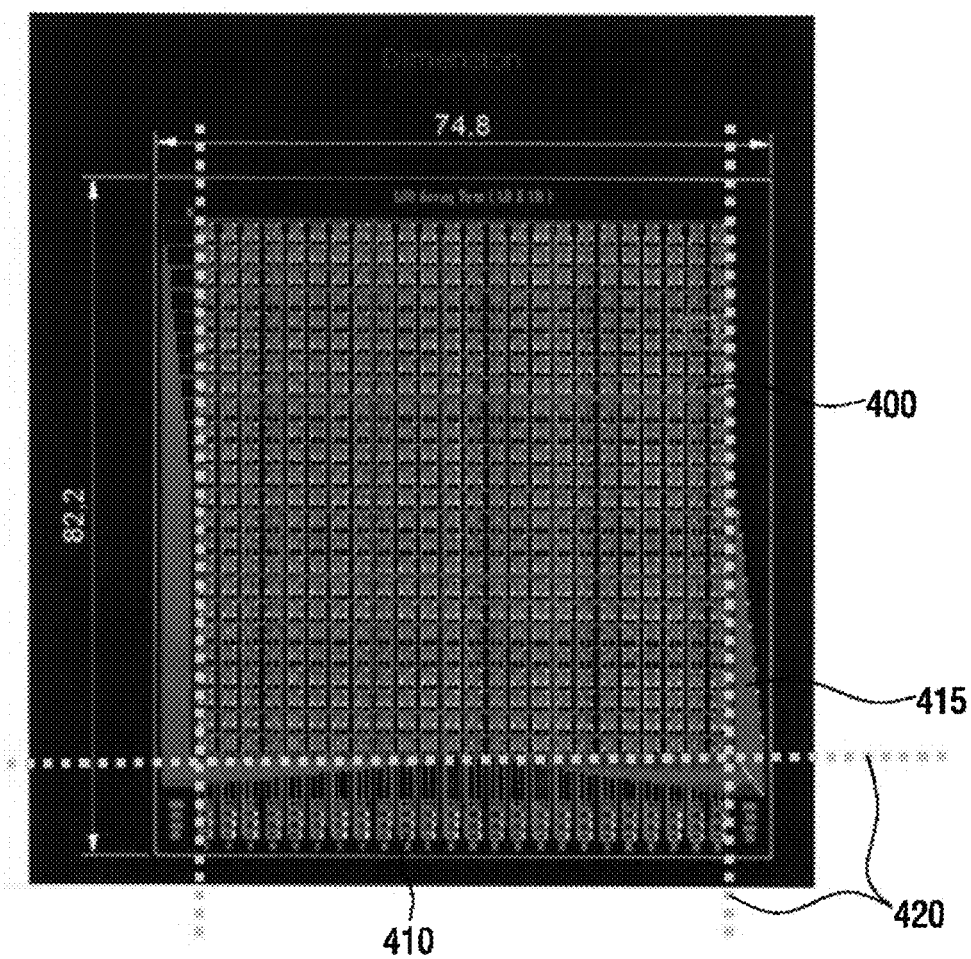
FIG. 4 is a plan view of a unit panel of FIG. 1.

FIG. 4 is a plan view of a unit panel of FIG. 1.

As shown in FIG. 4, a unit panel 110a of FIG. 1 according to an exemplary embodiment includes an LED matrix pattern area 400 and a driving IC pattern area 410 that are formed on an upper surface of one PET substrate when designing an LED (flexible) display apparatus.

Here, the LED matrix pattern area 400 corresponds to the "pixel area" described above, and the driving IC pattern area 410 corresponds to the "driving area". Here, a "pattern" may refer to a wiring or the like that is formed by being directly deposited on a substrate by rolling a process when forming a circuit wiring on a substrate by a roll method. As shown in FIG. 4, although the unit panel 110a extends or is extended by a folding a pattern 420 connecting the LED matrix pattern area 400 and the driving IC pattern area 410, a bezel may be eliminated. In other words, a zero bezel may be formed.

According to an exemplary embodiment, the LED matrix pattern area 400 and the driving IC pattern area 410 may be designed to be connected to each other on an upper surface of a substrate so as to dispose a connector for connecting power and a signal in the driving IC pattern area 410, and power may be applied and a signal may be received through the corresponding connector.

Also, pixel connection pads for installing R, G, and B LEDs may be constituted in the LED matrix pattern area 400 to be conducted to left and right connection lines 415 (without parts on a back surface) so as to be connected to the driving IC pattern area 410 formed at a bottom. Also, efficient production may be performed to reduce manufacturing processes by making a folding structure 420 once or a single time. Also, work productivity for an LED flexible display apparatus may be improved resulting in a lower error rate.

A driving IC 210a mentioned in FIG. 2 may be mounted in the driving IC pattern area 410 shown in FIG. 4. The driving IC 210a may include some or all of various types of drivers besides the display unit 340 mentioned in FIG. 3. Some elements, such as the interface unit 300, may be constituted as additional devices and then connected to the flexible display apparatus 90 according to the exemplary embodiment. Therefore, in an exemplary embodiment, some elements, such as the interface unit 300, may not be particularly limited to their constituted types.

Figure 5:
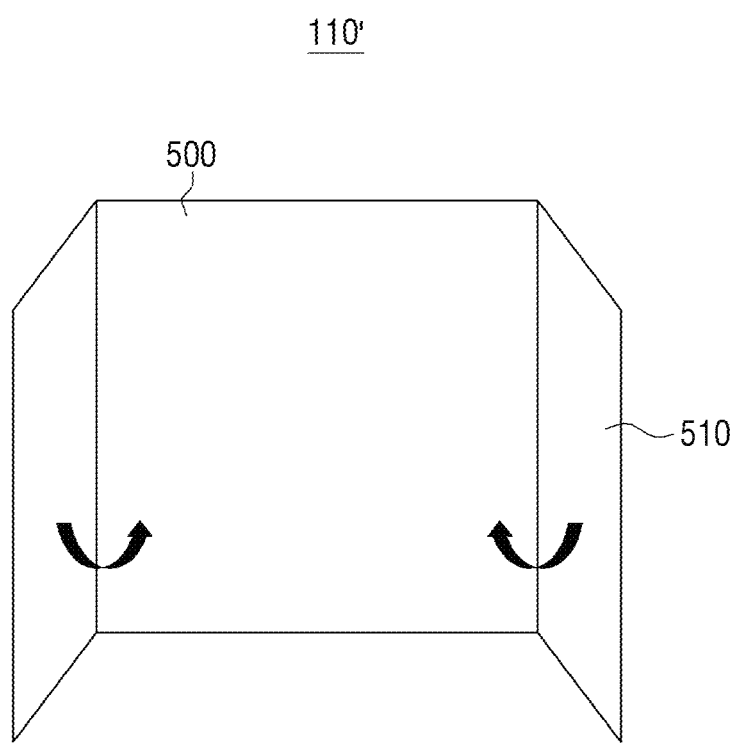
FIGS. 5 and 6 illustrate a display panel of a flexible display apparatus according to another exemplary embodiment.
Figure 6:
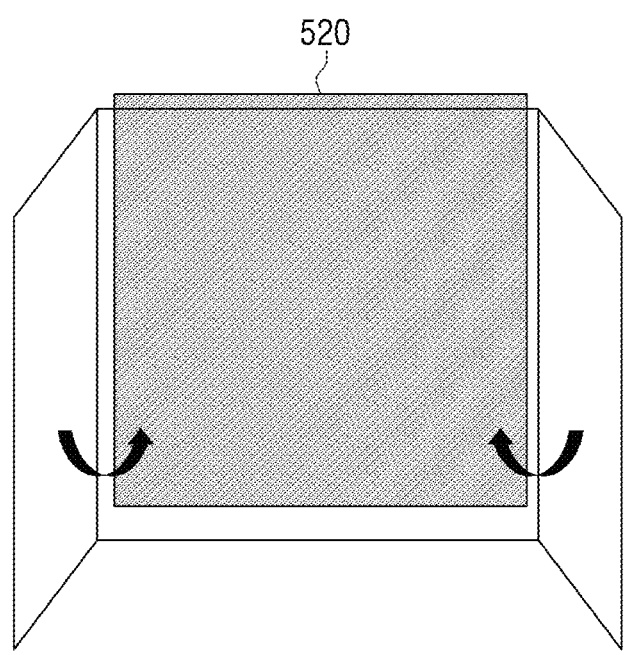

FIGS. 5 and 6 illustrate a display panel 110' of a flexible display apparatus according to another exemplary embodiment.

As shown in FIGS. 5 and 6, in comparison with the flexible display apparatus 90 shown in FIG. 1, the flexible display apparatus according to the present exemplary embodiment includes the display panel 110' that further includes a radiator 520 disposed between a pixel area 500 and a driving area 510, for example, a thermal radiator panel.

The radiator 520 may be a sheet type having thermal conductivity and may be flexible. According to an exemplary embodiment, the radiator 520 may include an aluminum (AL) plate type radiator panel.

Light emitting devices, such as (O)LEDs and the like, constituting the pixel area 500 and driving ICs constituted in the driving area 510 are all elements that produce heat. Therefore, this heat may affect an image realized or produced in the pixel area 500. In order to prevent this, the radiator 520 operates to rapidly emit heat generated in the two areas to the outside.

Figure 7:
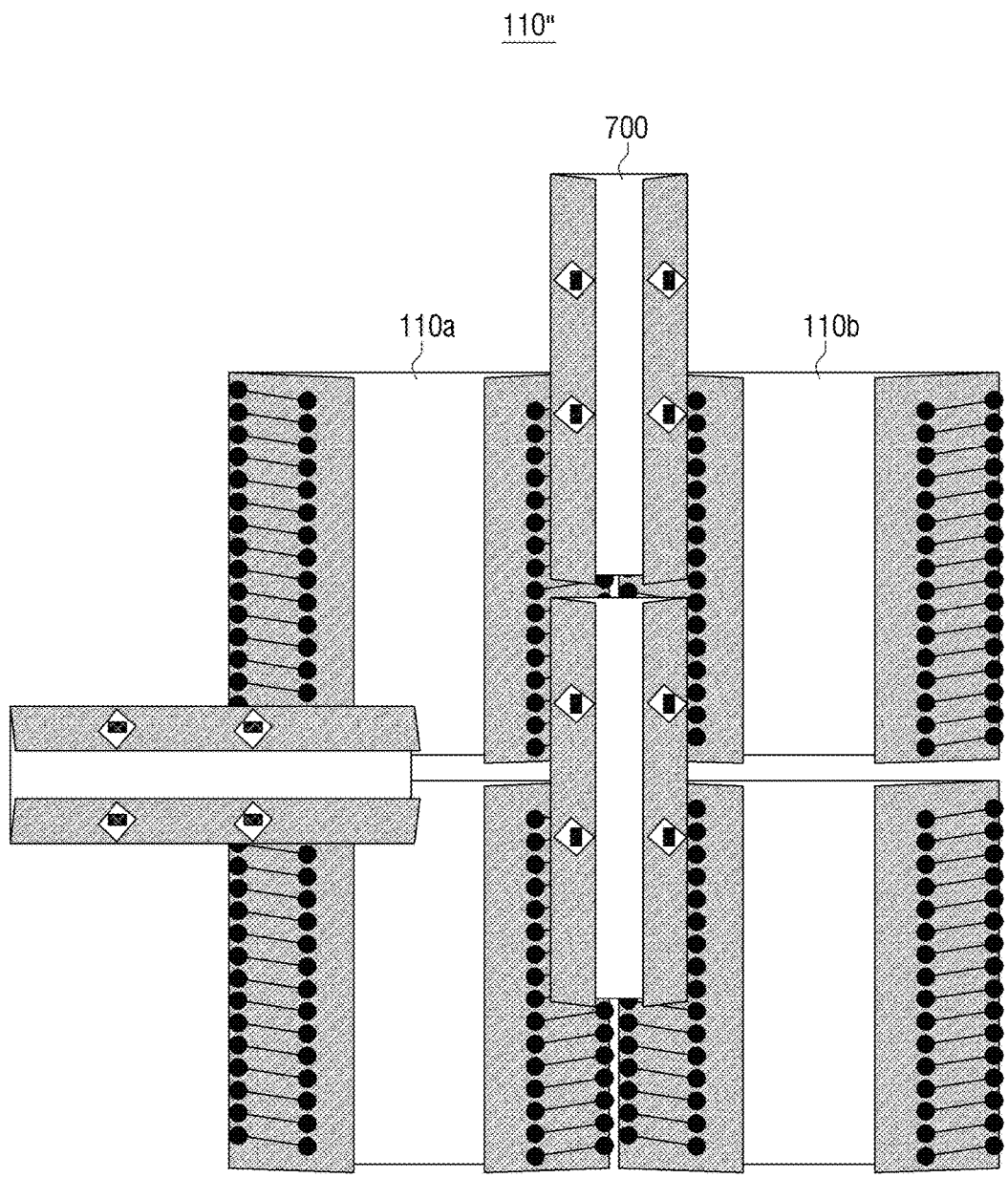
FIGS. 7 and 8 illustrate a display panel of a flexible display apparatus according to another exemplary embodiment.

FIGS. 7 and 8(a) and (b) illustrate a display panel 110" of a flexible display apparatus according to another exemplary embodiment.

Figure 8:
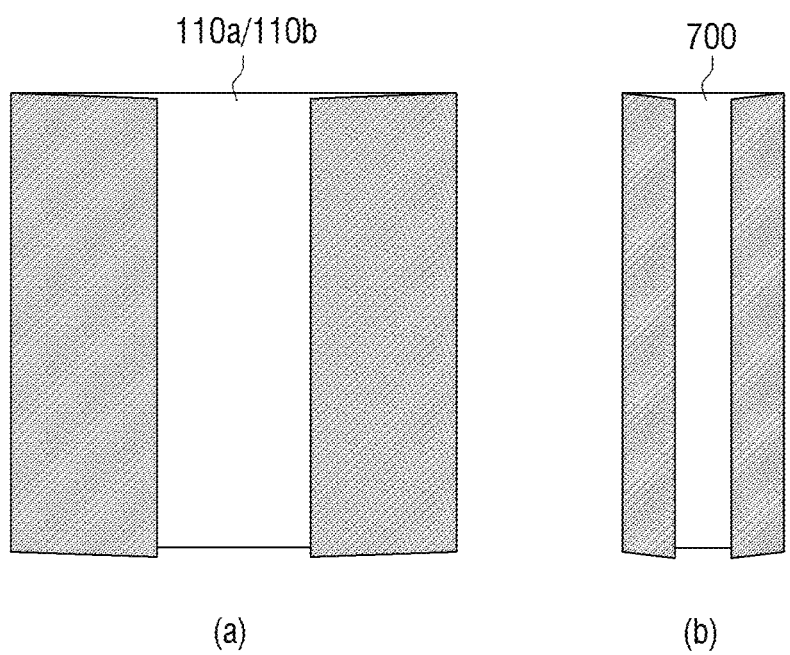

As shown in FIGS. 7 and 8, the display panel 110" of the flexible display apparatus according to the present exemplary embodiment may further include a circuit connection part 700 that connects a first unit panel 110a and a second unit panel 110b to each other.

In other words, in an exemplary embodiment, a pixel area displaying an image, i.e., a unit panel, is extendable. Therefore, for example, there may be a need for an operation of setting the first unit panel 110a as a master panel and the second unit panel 110b as a slave. As a result, the first unit panel 110a operating as the master may transmit pixel data, a control signal, and the like, and the second unit panel 110b operating as the slave may receive the pixel data and the control signal from the master so as to realize an image in a pixel area. For example, a first area of a unit image may be displayed on the first unit panel 110a, and a second area of the same unit image may be displayed on the second unit panel 110b.

Even in this case, in the flexible display apparatus according to the present exemplary embodiment, the first and second unit panels 110a and 110b and the circuit connection part 700 may be manufactured on one substrate in the same process, and thus manufacturing cost may be reduced.

For example, when circuit wirings of the first and second unit panels 110a and 110b are formed according to a printing method using a roller, wirings, i.e., patterns, may be formed on the circuit connection part 700 disposed on the same substrate, back to back. Therefore, cost may be reduced more than when the wirings are additionally manufactured. Also, after a final process, two areas are cut, separated at a cutting area, and assembled. Here, a rolling method may include a method of attaching the circuit wiring to the roller and then imprinting the circuit wiring on the substrate or a method of peeling off a metal thin film, which is formed on a substrate, from parts except wiring by using a roller. This may be equally applied to the display panels 110 described above. Here, different imprinting methods may be referred to as positive or negative methods, and a (SU-8 2002 UV) negative photoresist-polymer imprinting method may be used in an exemplary embodiment. These processes may be performed in a chamber.

Here, a process of mounting driving ICs on the first and second unit panels 110a and 110b and a process of mounting driving ICS on the circuit connection part 700 may be simultaneously performed but may be separately performed. Therefore, in an exemplary embodiment, the processes may not be particularly limited to this.

Figure 9:
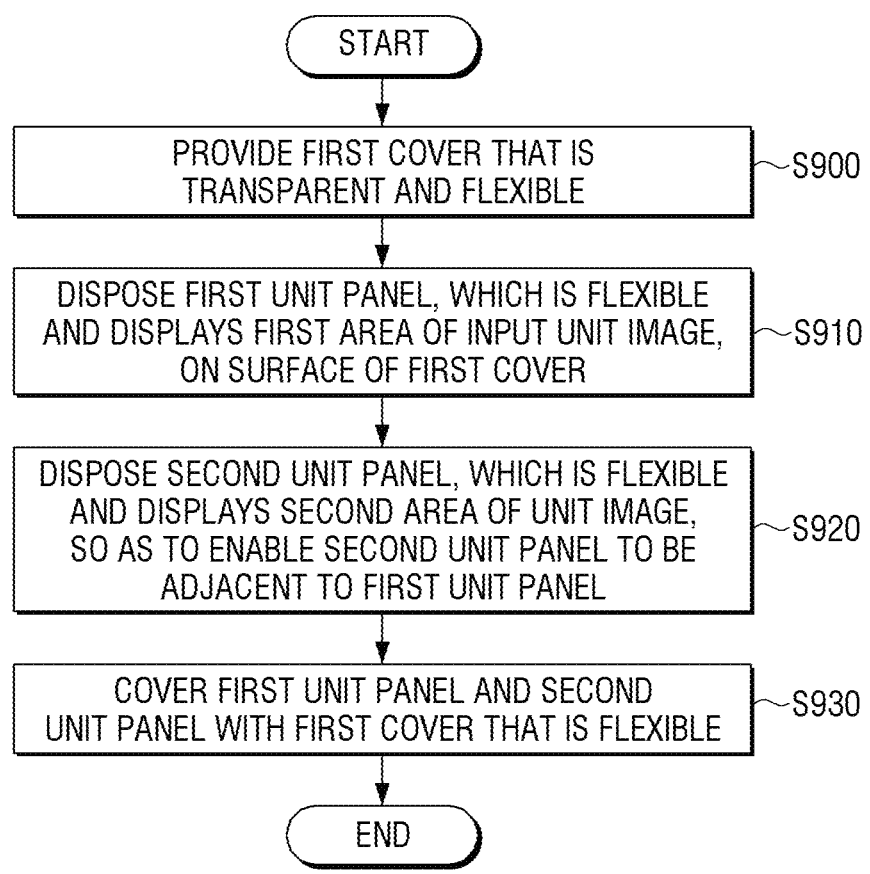
FIG. 9 is a flowchart of a process of manufacturing a flexible display apparatus according to an exemplary embodiment.

FIG. 9 is a flowchart of a process of manufacturing a flexible display apparatus according to an exemplary embodiment. Strictly, the process may correspond to an assembly method.

Referring to FIGS. 9 and 1, for convenience of description, in operation S900, a first cover 100 that is flexible and transparent is provided.

In operation S910, a first unit panel (or a first panel) may be disposed (or may be adhered) on a surface of the first cover 100, for example, on a back surface. Here, the "back surface" refers to an opposite side of the first cover 100 based on an image viewing direction of a user.

Here, the first unit panel includes a first pixel part that contacts the back surface of the first cover 100 and a first driving part that is folded at an edge of the first pixel part to be disposed on the first pixel part.

In operation S920, a second unit panel (or a second panel) including a second pixel part and a second driving part is disposed to be adjacent to the first unit panel. Here, since the second driving part is folded at an edge of the second pixel part to be disposed on the second pixel part, the first and second pixel parts may form a zero bezel. Here, a "bezel" basically refers to an edge part of a display on which an image is not displayed but means that a gap between pixels in a unit panel and a gap between pixels of a combination part are the same as each other in an exemplary embodiment, In operation S930, the first unit panel and the second unit panel are covered by using the second cover 120 having flexibility. For example, the second cover 120 may simultaneously enclose the second unit panel and may be combined with the first cover 100.

The foregoing exemplary embodiments and advantages are merely exemplary and are not to be construed as limiting the embodiments. The present teaching can be readily applied to other types of apparatuses. Also, the description of the exemplary embodiments is intended to be illustrative, and not to limit the scope of the claims, and many alternatives, modifications, and variations will be apparent to those skilled in the art.

What is claimed is:

1. A flexible display apparatus, comprising:
   a first cover;
   a display panel configured to be disposed on a surface of the first cover, comprising:
      a first panel configured to be divided into a first pixel part and a first driving part to enable the first pixel part, the first driving part being folded based on a first folding line, and
      a second panel configured to be divided into a second pixel part and a second driving part to enable the second pixel part, the second driving part being folded based on a second folding line; and
   a second cover configured to cover a back surface of the display panel,
      wherein the first panel and the second panel are respectively folded on the first folding line and the second folding line to be adjacent to each other to provide a single image.

2. The flexible display apparatus of claim 1, wherein the first cover is formed of a film poly material.

3. The flexible display apparatus of claim 1, wherein the first panel displays a first area of the single image, and the second panel displays a second area of the single image.

4. The flexible display apparatus of claim 3, further comprising:

a radiator panel disposed between the first pixel part and the first driving part and between the second pixel part and the second driving part to emit heat.

5. The flexible display apparatus of claim 4, the radiator panel is formed of a flexible thermally conductive material.

6. The flexible display apparatus of claim 3, further comprising:
a circuit connection part configured to be disposed on the first driving part and the second driving part to connect the first driving part and the second driving part to each other.

7. The flexible display apparatus of claim 6, wherein a first substrate on which the first pixel part and the first driving part are formed and a second substrate on which the second pixel part and the second driving part are formed are formed of an equivalent material.

8. The flexible display apparatus of claim 1, wherein at least a surface of the first cover has an uneven surface to improve image quality of an image provided for a user.

9. The flexible display apparatus of claim 8, wherein the at least a surface of the first cover comprises an embossed pattern to enable the first cover to have the uneven surface.

10. The flexible display apparatus of claim 1, wherein the first panel and the second panel are disposed to be adjacent to each other to produce a zero bezel, wherein a fixed gap between pixels of the first panel and the second panel is maintained by the zero bezel.

11. A method of manufacturing a flexible display apparatus, the method comprising:
providing a first cover;
disposing a first panel on a surface of the first cover, wherein the first panel is divided into a first pixel part and a first driving part to enable the first pixel part, the first driving part being folded based on a first folding line;
disposing a second panel to be adjacent to the first panel, wherein the second panel is divided into a second pixel part and a second driving part to enable the second pixel part and the second driving part being folded based on a second folding line; and
covering the first panel and the second panel with a second cover,
wherein the first panel and the second panel are respectively folded on the first folding line and the second folding line to be adjacent to each other to provide a single image.

12. The method of claim 11, wherein the first cover is formed of a film poly material.

13. The method of claim 12, further comprising:
disposing a thermal radiator panel between the first pixel part and the first driving part and between the second pixel part and the second driving part and to emit heat.

14. The method of claim 13, wherein the radiator panel is formed of a flexible conductive material.

15. The method of claim 11, wherein the first panel is constituted to display a first area of the single image, and the second panel is constituted to display a second area of the single image.

16. The method of claim 15, further comprising:
disposing a circuit connection part to connect the first driving part and the second driving part to each other, on the first driver part and the second driver part.

17. The method of claim 16, wherein a first substrate on which the first pixel part and the first driving part are formed and a second substrate on which the second pixel part and the second driving part are formed of an equivalent material.

18. The method of claim 11, wherein at least a surface of the first cover has an uneven surface to improve a quality of an image provided for a user.

19. The method of claim 18, wherein the at least surface of the first cover comprises an embossed pattern to enable the first cover to have the uneven surface.

20. The method of claim 11, wherein the first panel and the second panel are disposed to be adjacent to each other to produce a zero bezel that maintains a fixed gap between pixels of the first panel and the second panel.

* * * * *

UNITED STATES PATENT AND TRADEMARK OFFICE
CERTIFICATE OF CORRECTION

PATENT NO. : 10,103,204 B2
APPLICATION NO. : 15/651193
DATED : October 16, 2018
INVENTOR(S) : Joon-hyun Yang Page 1 of 1

It is certified that error appears in the above-identified patent and that said Letters Patent is hereby corrected as shown below:

In the Claims

Column 11, Lines 16-17:
In Claim 7, after "are formed" delete "are formed".

Signed and Sealed this
Twelfth Day of February, 2019

Andrei Iancu
*Director of the United States Patent and Trademark Office*